(12) United States Patent
Kang

(10) Patent No.: US 6,762,001 B2
(45) Date of Patent: Jul. 13, 2004

(54) METHOD OF FABRICATING AN EXPOSURE MASK FOR SEMICONDUCTOR MANUFACTURE

(75) Inventor: Sang Woo Kang, Seoul (KR)

(73) Assignee: Hynix Semiconductor Inc., Ich'on (KR)

( * ) Notice: Subject to any disclaimer, the term of this patent is extended or adjusted under 35 U.S.C. 154(b) by 272 days.

(21) Appl. No.: 10/003,287

(22) Filed: Dec. 6, 2001

(65) Prior Publication Data

US 2003/0044694 A1 Mar. 6, 2003

(30) Foreign Application Priority Data

Sep. 5, 2001 (KR) ........................................ 2001-54510

(51) Int. Cl.[7] .............................. G03F 9/00; G03C 5/00
(52) U.S. Cl. ........................................... 430/5; 430/296
(58) Field of Search ..................................... 430/5, 296

(56) References Cited

U.S. PATENT DOCUMENTS

| 5,633,507 A | 5/1997 | Pfeiffer et al. |
| 5,912,468 A | 6/1999 | Hirano et al. |
| 6,245,488 B1 | 6/2001 | Furukawa et al. |
| 6,514,647 B1 * | 2/2003 | Hinogami et al. ............ 430/22 |
| 6,613,482 B1 * | 9/2003 | Yano et al. ..................... 430/5 |

FOREIGN PATENT DOCUMENTS

JP      00-066368      3/2000      ............. G03F/1/08

* cited by examiner

Primary Examiner—Mark F. Huff
Assistant Examiner—Saleha Mohamedulla
(74) Attorney, Agent, or Firm—Jacobson Holman PLLC

(57) ABSTRACT

A method of fabricating an exposure mask including the steps of forming a chrome layer, a first photo resist, an Ag layer as a conductive layer and a second photo resist on a transparent quartz substrate, in sequence; forming and using a second photo resist pattern to form a conductive layer pattern by etching the conductive layer; removing the second photo resist pattern; forming an oxide layer for shielding light at the surface of the conductive layer pattern and exposing the first photo resist using the conductive layer pattern with the oxide layer thereon; forming a first photo resist pattern exposing the chrome layer and forming a mask pattern including the chrome layer by selectively etching the exposed chrome layer; and removing the conductive layer pattern including the oxide and the first photo resist pattern.

18 Claims, 2 Drawing Sheets

US 6,762,001 B2

METHOD OF FABRICATING AN EXPOSURE MASK FOR SEMICONDUCTOR MANUFACTURE

BACKGROUND OF THE INVENTION

1. Field of the Invention

The present invention relates to a fabrication method of a semiconductor device and, more particularly, to a method of fabricating an exposure mask for semiconductor manufacture to improve the accuracy of pattern-critical dimensions of the exposure mask.

2. Description of the Related Art

As is well known, in a semiconductor manufacturing process, contact holes and other patterns are generally formed in accordance with photolithography processes. The photolithography process comprises a process for coating photo sensitive polymer (hereinafter, referred to as photo resist) on a layer to be etched, a process for selectively exposing the coated photo resist by using a predetermined exposure mask, and a process for development to form a photo resist pattern in a predetermined shape by removing the exposed or unexposed part of the photo resist using a predetermined chemical solution.

As mentioned above, exposure of the photo resist is accomplished by using an exposure mask. The exposure mask generally has a structure such that an opaque chrome pattern is formed on a transparent quartz substrate.

According to a conventional method for manufacturing the exposure mask, the opaque chrome layer and the photo resist sensitizing to E-beam are sequentially formed on the quartz substrate and then an E-beam is irradiated on the photo resist. Subsequently, development and etching processes are performed in sequence.

However, as shown in FIG. 1, the conventional method has a problem in that during the exposure process on a photo resist 3 using E-beam 20, charge-up 4 of the exposure area is not completely controlled, resulting in failure to obtain a mask pattern of desirable critical dimension. In FIG. 1, the photoresist 3 is shown overlying a chrome layer 2 on a quartz substrate 1.

According to the conventional method, in order to prevent charge-up during the E-beam exposure, layout of the chrome layer 2 for shielding light is controlled to prevent burst of the mask pattern. However, in consideration of the layout of a circuit pattern realized on a wafer, the above-mentioned method has a limitation in controlling the layout of the chrome layer and therefore, it is difficult to prevent charge-up, especially local charge-up.

As a result, it is difficult to achieve the critical dimension accuracy of a mask pattern required for fabricating an exposure mask for manufacture of a highly-integrated circuit over 256 M and therefore, it is practically difficult to realize an exposure mask for a highly-integrated circuit.

SUMMARY OF THE INVENTION

Therefore, the present invention has been made to solve the above problems and an object of the present invention is to provide a method of fabricating exposure mask for semiconductor manufacture to improve the critical dimension accuracy of mask patterns.

Another object of the present invention is to improve the critical dimension accuracy of a mask pattern, thereby providing a method of fabricating an exposure mask for semiconductor manufacture capable of producing an exposure mask for highly-integrated circuit manufacture and highly-integrated circuits.

In order to accomplish the above objects, the present invention is directed to a method comprising the steps of forming a chrome layer, a first photo resist, a conductive layer and a second photo resist on a transparent quartz substrate, in sequence; forming a second photo resist pattern by exposing and developing the second photo resist; forming a conductive layer pattern by etching the conductive layer using the second photo resist pattern as an etch barrier; removing the second photo resist pattern; forming an oxide layer as a layer for shielding light at the surface of the conductive layer pattern by oxidizing the conductive layer pattern; exposing the first photo resist using the conductive layer pattern having the oxide layer at the surface thereof; forming a first photo resist pattern exposing the chrome layer by developing the exposed first photo resist; forming a mask pattern including the chrome layer by selectively etching the exposed chrome layer parts; and removing the conductive layer pattern including the oxide layer and the first photo resist pattern.

In the method of fabricating an exposure mask according to the present invention, an Ag layer is formed as the conductive layer, the second photo resist is exposed by using a high voltage E-beam or focused ion beam as the light source, and the first photo resist is exposed by using G-line, I-line or KrF as the light source.

The objects and features of the invention may be understood with reference to the following detailed description of an illustrative embodiment of the invention, taken together with the accompanying drawings.

DETAILED DESCRIPTION OF THE PREFERRED EMBODIMENTS

Figure 1:
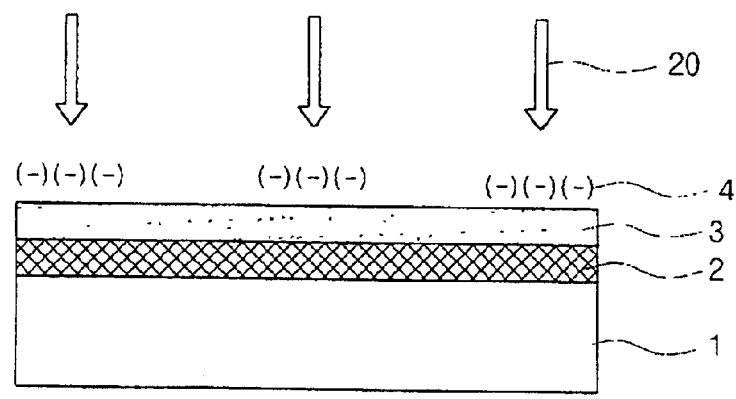
FIG. 1 is a drawing showing a conventional method of fabricating an exposure mask.
Figure 2A:
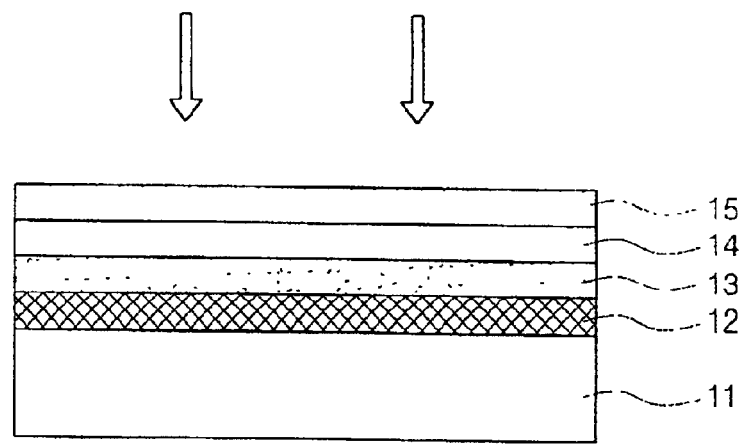
FIGS. 2A to 2E are drawings showing a method of fabricating an exposure mask according to an embodiment of the present invention.

Referring to FIG. 2A, an opaque chrome layer 12 and a first photo resist 13 are sequentially formed on a transparent quartz substrate 11. The first photo resist 13 is sensitized to G-line ($\lambda$=436 nm), I-line ($\lambda$=365 nm) or KrF($\lambda$=248 nm). A predetermined conductive layer, for example an Ag layer 14, is deposited on the first photo resist 13 to a thickness of over 500 Å, desirably between 500 and 3,000 Å, and more accurately, 1,500 to 2,500 Å in accordance with sputtering or Metal Organic Chemical Vapor Deposition (MOCVD) process. A second photo resist 15 is coated on the Ag layer 14 and then the second resist 15 is exposed by using a high voltage E-beam or focused ion beam as a light source.

Figure 2B:
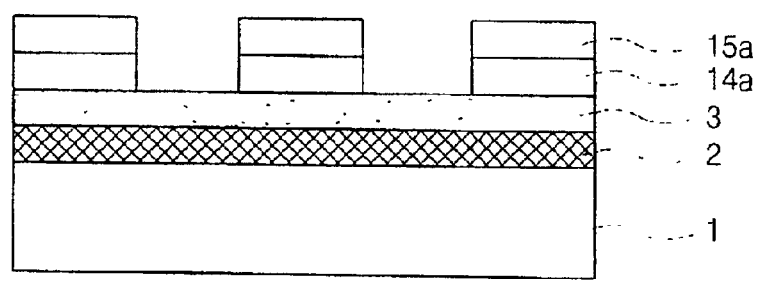

Referring to FIG. 2B, a second photo resist pattern 15a is formed by developing the exposed second photo resist. The Ag layer 14 is etched by using the second photo resist 15a pattern as an etch barrier, thereby forming an Ag pattern 14a in the shape of the circuit pattern to be obtained.

Figure 2C:
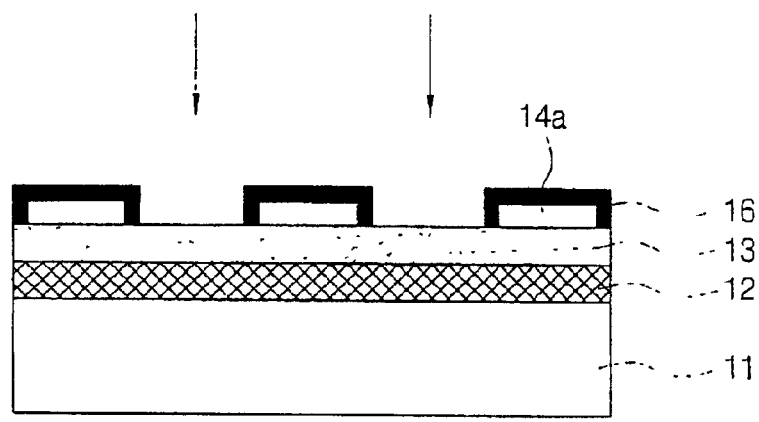

Referring to FIG. 2C, the second photo resist pattern 15a is then removed. The resulting structure is subjected to an oxidation process at a temperature of 200 to 300° C. and at a pressure of 500 to 1,000 mTorr for 100 to 150 seconds by using $O_2$ or $O_3$ plasma, thereby forming an Ag oxide layer (AgO$_x$) 16 on the surface of the Ag pattern 14a. The Ag oxide layer 16 is discolored to be black due to properties of the material and is employed as a layer for shielding light during the following exposure process. The first photo resist 13, which is selectively light shielded by the Ag oxide layer 16, is exposed by using a light source of G-line (λ=436 nm), I-line (λ=365 nm) or KrF(λ=248 nm).

Figure 2D:
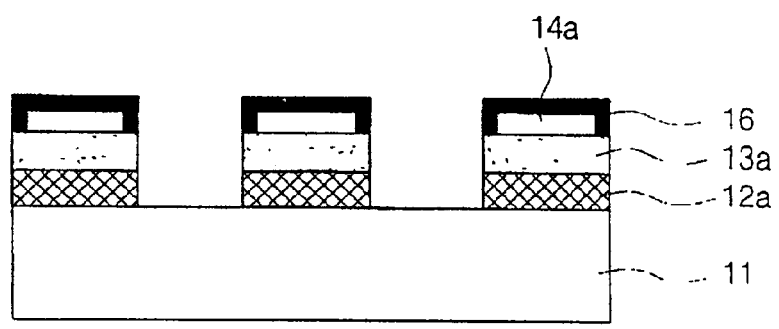

Referring to FIG. 2D, the exposed first photo resist is developed, thereby forming a first photo resist pattern 13a partially exposing the chrome layer. Then, the exposed chrome layer parts are etched by using dry etching process to form a chrome pattern, that is, a mask pattern 12a.

Figure 2E:
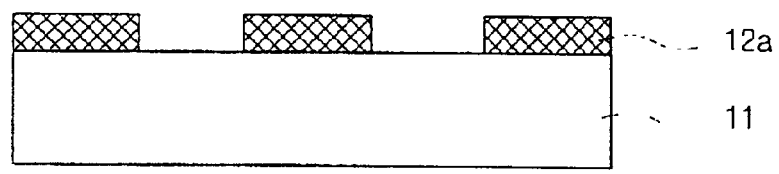

Referring to FIG. 2E, the remaining Ag pattern including Ag oxide layer is removed in accordance with dry etching process using gas such as $Cl_2BCl_3$ and then the remaining first photo resist pattern 13a is removed by $O_2$ ashing. A cleaning process is then performed, thereby completing the exposure mask according to the present invention.

According to the present invention, because the Ag pattern including the Ag oxide layer is formed in the shape of the circuit pattern to be obtained on the first photo resist and then the first photo resist is exposed by using the Ag oxide layer, fluctuation in critical dimensions of the mask pattern due to local charge-up is prevented.

That is, the Ag layer prevents local charge-up since the layer is a metal layer and the Ag oxide layer is employed as a layer for shielding light in the following exposure process due to its property for shielding light. Therefore, during E-beam exposure process, the occurrence of charge-up is prevented, thereby solving the problem of fluctuation in critical dimensions of the mask pattern.

As a result, according to the present invention, it is possible to improve the accuracy of the critical dimension of the mask pattern, thereby obtaining an exposure mask able to realize a highly-integrated circuit pattern.

As described above, prior to exposure of the photo resist, the light shielding layer pattern is additionally formed in the shape of the circuit pattern to be obtained on the photo resist and the following exposure process on the photo resist is performed by using the light shielding layer pattern, thereby preventing any reduction in accuracy of the critical dimensions of the mask pattern.

Therefore, it is possible to improve accuracy in the critical dimension of the mask pattern and to manufacture an efficient exposure mask, thereby realizing highly-integrated circuits over 256 M.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating an exposure mask for semiconductor manufacture comprising the steps of:
    forming a chrome layer, a first photo resist, an Ag layer as a conductive layer and a second photo resist on a transparent quartz substrate, in sequence;
    forming a second photo resist pattern by exposing and developing the second photo resist;
    forming a conductive layer pattern by etching the conductive layer using the second photo resist pattern as an etch barrier;
    removing the second photo resist pattern;
    forming an oxide layer as a layer for shielding light at a surface of the conductive layer pattern by oxidizing the conductive layer pattern;
    exposing the first photo resist using the conductive layer pattern having the oxide layer at the surface thereof;
    forming a first photo resist pattern exposing a part of the chrome layer by developing the exposed first photo resist;
    forming a mask pattern including the chrome layer by selectively etching the exposed chrome layer part; and
    removing the conductive layer pattern including the oxide layer and the first photo resist pattern.

2. The method of fabricating an exposure mask for semiconductor manufacture according to claim 1, wherein the Ag layer is formed to a thickness of 500 to 3,000 Å by using sputtering or MOCVD process.

3. A The method of fabricating an exposure mask for semiconductor manufacture according to claim 1, wherein the oxide layer is an Ag oxide layer ($AgO_x$).

4. The method of fabricating an exposure mask for semiconductor manufacture according to claim 3, wherein the oxidation process of the Ag layer is performed at a temperature of 200 to 300° C. at a pressure of 500 to 1,000 mTorr for 100 to 150 seconds by using $O_2$ or $O_3$ plasma.

5. The method of fabricating an exposure mask for semiconductor manufacture according to claim 1, wherein the second photo resist is exposed by using a high voltage E-beam or focused ion beam as a light source.

6. The method of fabricating an exposure mask for semiconductor manufacture according to claim 1, wherein the first photo resist is exposed by using G-line (λ=436 nm), I-line (λ=365 nm) or KrF (λ=248 nm) as a light source.

7. The method of fabricating an exposure mask for semiconductor manufacture according to claim 1, wherein the conductive layer pattern including the oxide layer is removed in accordance with a dry etching process using $Cl_2BCl_3$ gas.

8. The method of fabricating an exposure mask for semiconductor manufacture according to claim 1, wherein the first photo resist pattern is removed by using $O_2$ ashing.

9. The method of fabricating an exposure mask for semiconductor manufacture according to claim 1, further comprising the step of cleaning the mask pattern, after the conductive layer pattern including the oxide layer and the first photo resist pattern are removed.

10. A method of fabricating an exposure mask for semiconductor manufacture comprising the steps of:
    forming a chrome layer, a first photo resist, an Ag layer as a conductive layer and a second photo resist on a transparent quartz substrate;
    forming a second photo resist pattern from the second photo resist;
    forming a conductive layer pattern from the conductive layer using the second photo resist pattern;
    removing the second photo resist pattern;
    forming an oxide layer as a layer for shielding light at a surface of the conductive layer pattern;
    exposing the first photo resist using the conductive layer pattern;
    forming a first photo resist pattern exposing a part of the chrome layer by developing the exposed first photo resist;
    forming a mask pattern including the chrome layer by selectively etching the exposed chrome layer part; and
    removing the conductive layer pattern including the oxide layer and the first photo resist pattern.

11. The method of fabricating an exposure mask for semiconductor manufacture according to claim 10, wherein the Ag layer is formed to a thickness of 500 to 3,000 Å by using sputtering or MOCVD process.

12. The method of fabricating an exposure mask for semiconductor manufacture according to claim 10, wherein the oxide layer is an Ag oxide layer ($AgO_x$).

13. The method of fabricating an exposure mask for semiconductor manufacture according to claim 12, wherein the oxidation process of the Ag layer is performed at a temperature of 200 to 300° C. at a pressure of 500 to 1,000 mTorr for 100 to 150 seconds by using $O_2$ or $O_3$ plasma.

14. The method of fabricating an exposure mask for semiconductor manufacture according to claim 10, wherein the second photo resist pattern is formed by exposing the second photo resist using a high voltage E-beam or focused ion beam as a light source.

15. The method of fabricating an exposure mask for semiconductor manufacture according to claim 10, wherein the first photo resist is exposed by using G-line ($\lambda$=436 nm), I-line ($\lambda$=365 nm) or KrF ($\lambda$=248 nm) as a light source.

16. The method of fabricating an exposure mask for semiconductor manufacture according to claim 10, wherein the conductive layer pattern including the oxide layer is removed in accordance with a dry etching process using $Cl_2BCl_3$ gas.

17. The method of fabricating an exposure mask for semiconductor manufacture according to claim 10, wherein the first photo resist pattern is removed by using $O_2$ ashing.

18. The method of fabricating an exposure mask for semiconductor manufacture according to claim 10, further comprising the step of cleaning the mask pattern, after the conductive layer pattern including the oxide layer and the first photo resist pattern are removed.

* * * * *